United States Patent [19]
Imai et al.

[11] Patent Number: 5,440,157
[45] Date of Patent: Aug. 8, 1995

[54] SEMICONDUCTOR INTEGRATED-CIRCUIT CAPACITOR HAVING A CARBON FILM ELECTRODE

[75] Inventors: Keitaro Imai, Kawasaki; Haruo Okano, Tokyo; Tomonori Aoyama; Yasunori Okayama, both of Kawasaki, all of Japan

[73] Assignee: Kabushiki Kaisha Toshiba, Kawasaki, Japan

[21] Appl. No.: 94,422

[22] Filed: Jul. 16, 1993

[30] Foreign Application Priority Data

Jul. 17, 1992 [JP] Japan .................................. 4-191117
Jul. 2, 1993 [JP] Japan .................................. 5-164726

[51] Int. Cl.$^6$ ...................... H01L 29/43; H01L 29/92
[52] U.S. Cl. .................... 257/310; 257/741; 257/750
[58] Field of Search ............... 257/77, 295, 310, 741, 257/750, 754, 296, 301, 306, 532, 535; 365/102

[56] References Cited
U.S. PATENT DOCUMENTS 4,380,803  4/1983  Tuan ..................... 365/102
4,472,726  9/1984  DiMaria et al. ............. 365/102
4,897,710  1/1990  Suzuki et al. .............. 257/279
5,124,777  6/1992  Lee ...................... 257/310
5,206,787  4/1993  Fujioka .................... 257/77

FOREIGN PATENT DOCUMENTS 100454   9/1978  Japan .
103148   9/1978  Japan .
 99962   8/1979  Japan .
0084578  5/1984  Japan ..................... 257/295
 80007   3/1989  Japan .
0056160  2/1992  Japan .

Primary Examiner—William Mintel
Assistant Examiner—Peter Toby Brown
Attorney, Agent, or Firm—Oblon, Spivak, McClelland, Maier, & Neustadt

[57] ABSTRACT

A semiconductor integrated-circuit capacitor comprises a lower electrode formed on a semiconductor substrate, a capacitor insulating film formed on the lower electrode, and an upper electrode formed on the capacitor insulating film. The capacitor insulating film is made of a high-permittivity material, and at least one of the upper and lower electrodes is made of a carbon film or a multilayered film composed of a carbon film and a conductor film other than carbon.

14 Claims, 10 Drawing Sheets

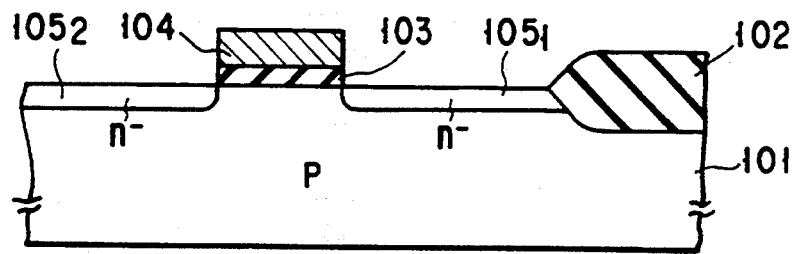
F I G. 3A
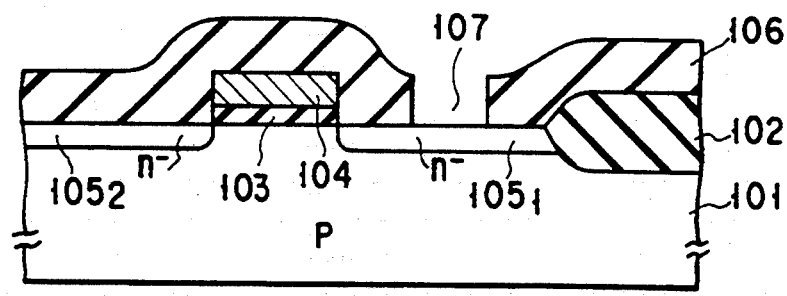
F I G. 3B
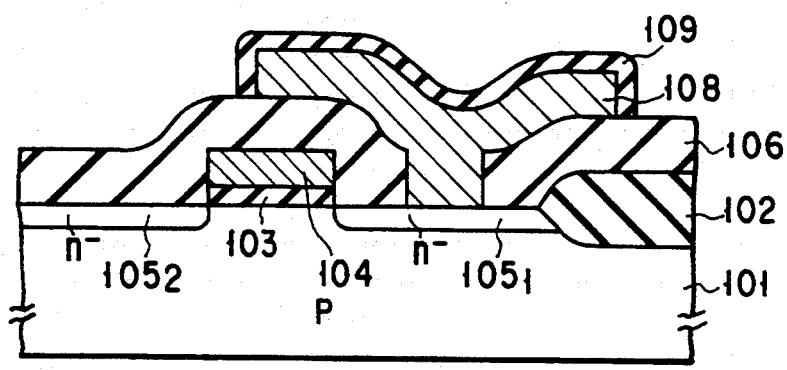
F I G. 3C
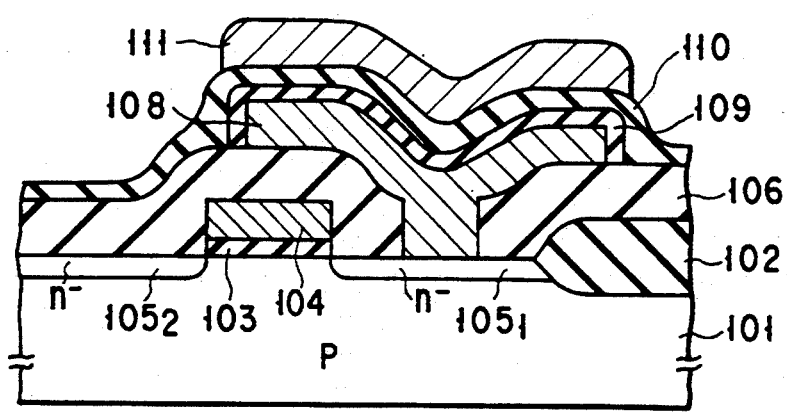
F I G. 3D

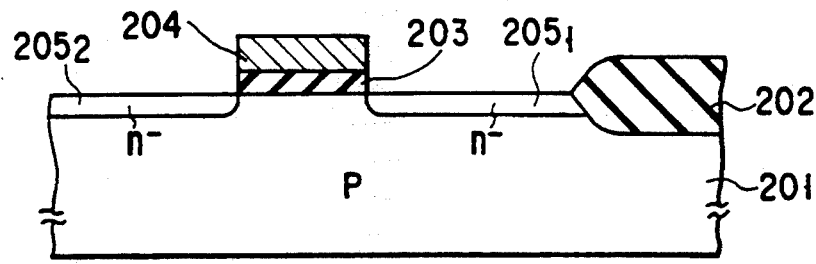
F I G. 4A
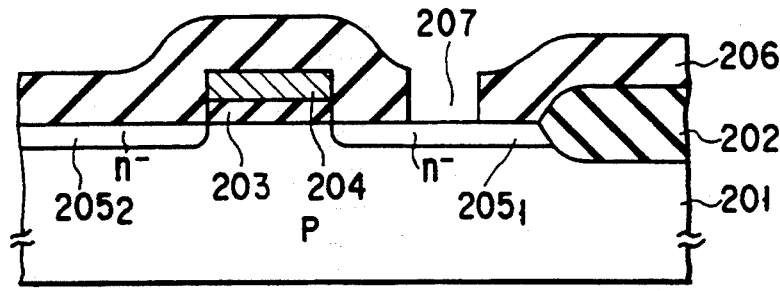
F I G. 4B
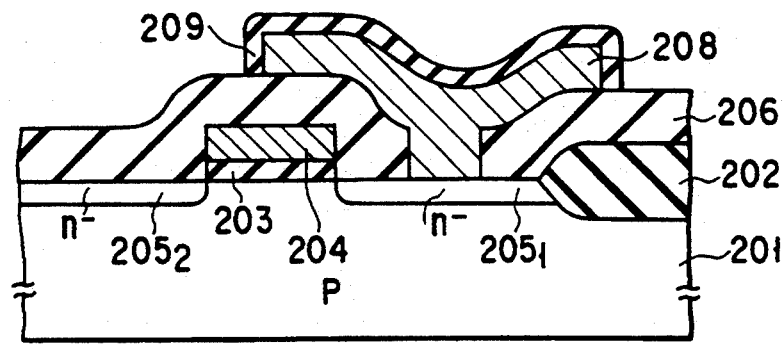
F I G. 4C
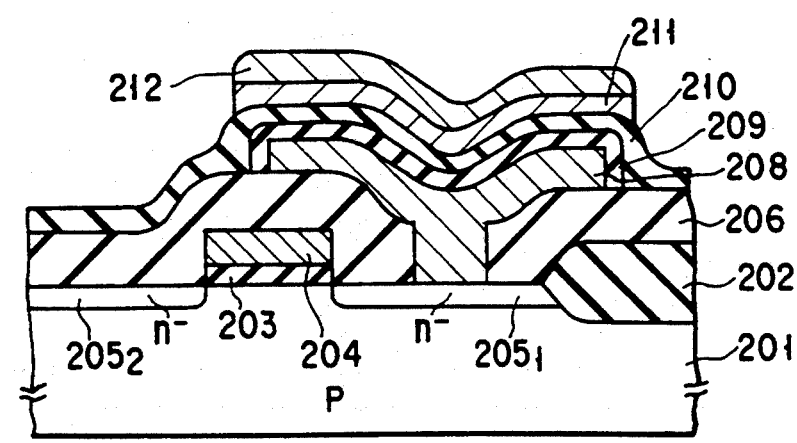
F I G. 4D

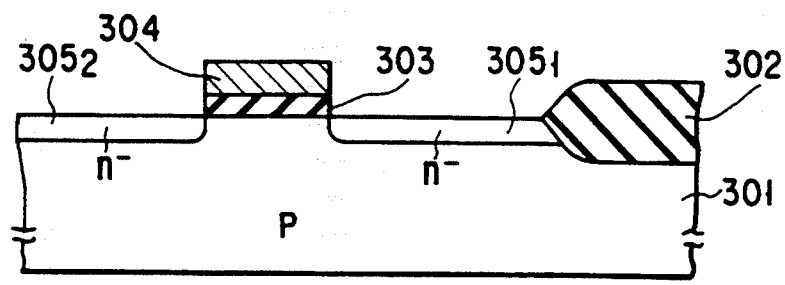
F I G. 5A
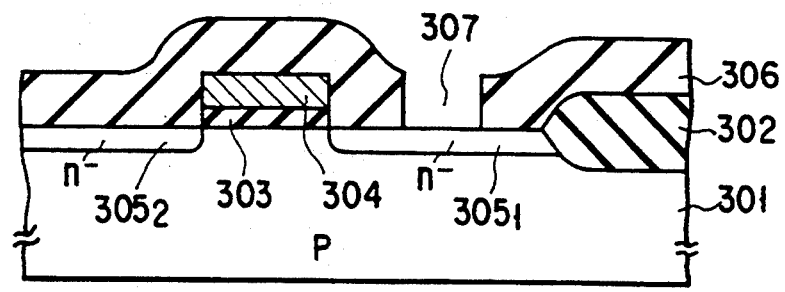
F I G. 5B
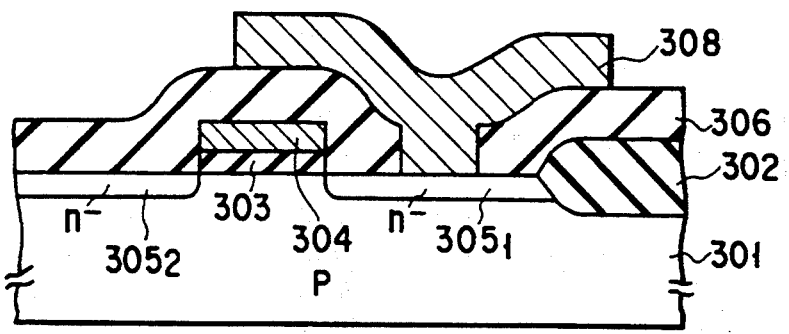
F I G. 5C
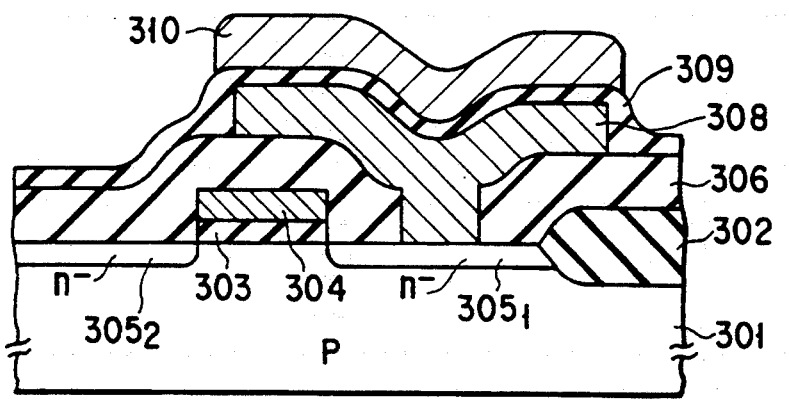
F I G. 5D

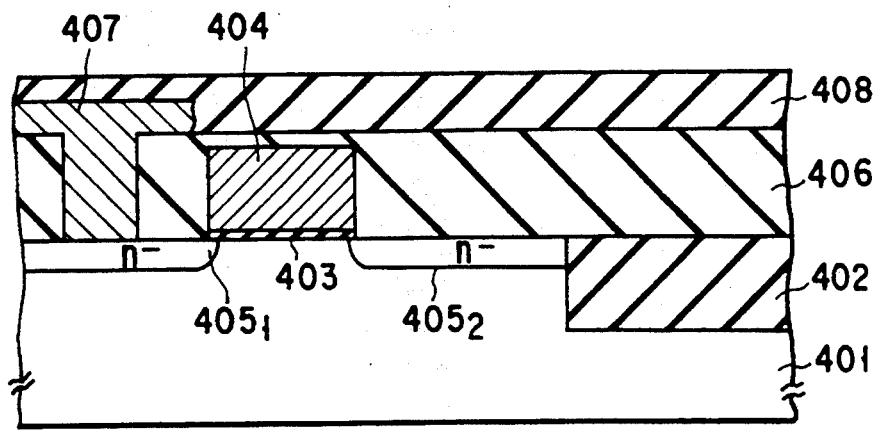
F I G. 6A
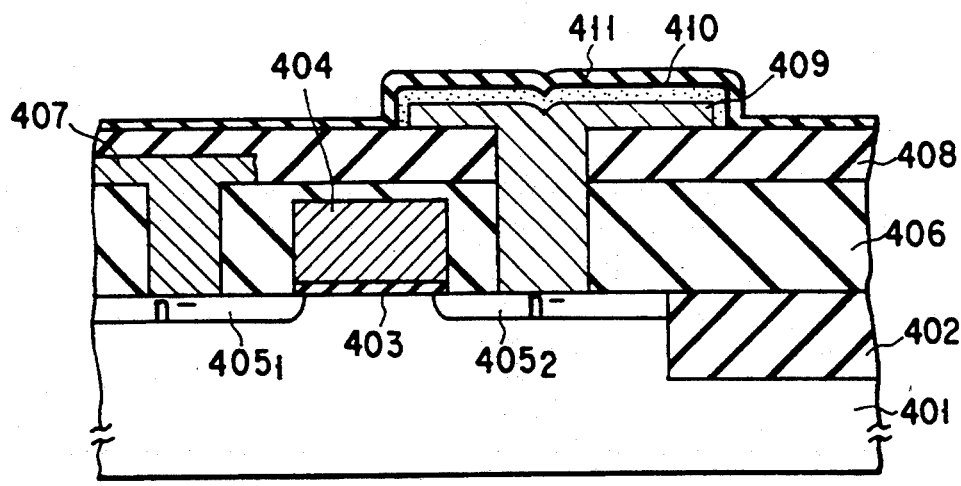
F I G. 6B
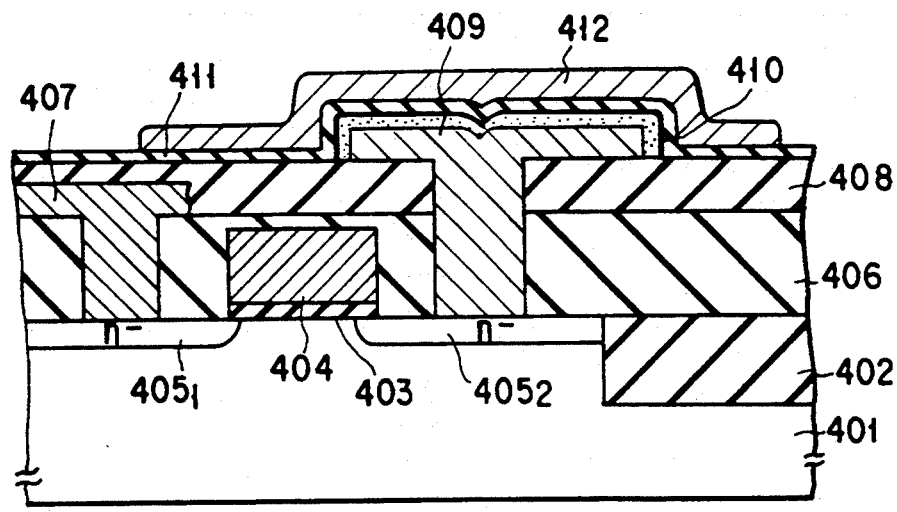
F I G. 6C

SEMICONDUCTOR INTEGRATED-CIRCUIT CAPACITOR HAVING A CARBON FILM ELECTRODE

Background of the Invention

1. Field of the Invention

The present invention relates to a semiconductor integrated-circuit capacitor and a method of manufacturing the same.

2. Description of the Related Art

As a type of semiconductor device adapted for information storage, there is a dynamic random access read-write memory (DRAM) whose storage cells are based on transistor-capacitor combinations. In a capacitor used in a storage cell in such a DRAM, as its electrodes use is made of a material, such as polysilicon, tungsten (w), molybdenum (Mo), or aluminum (Al). As an insulating film sandwiched between the two electrodes of the capacitor, serving as the capacitor insulating film (dielectric film), a silicon oxide film is used.

With recent rapid large-scale integration of such semiconductor devices, it has been required that the capacitance of capacitors be increased. With a conventional capacitor structure, this requirement will be met by reducing the thickness of silicon oxide film used as an insulating film to a great extent because silicon oxide is low in permittivity or dielectric constant. However, reducing the thickness of the capacitor insulating film too much will result in an increase in current leakage.

For this reason, instead of reducing the thickness of the capacitor insulating film, the use of an insulating film having higher permittivity than the silicon oxide film is now being considered. Specifically, metal compounds including perovskite dielectric material, such as tantalum pentoxide, PZT(Pb(Ti, Zr)$O_3$), etc., are under consideration. The dielectric constant of tantalum pentoxide film is approximately seven times as high as the dielectric constant of silicon oxide film.

On the one hand, however, these metal compounds exhibit high permittivity, but on the other hand they are small in forbidden band width (band gap) and hence have a poor insulating capability. Consequently, the use of these materials as a capacitor insulating film would also cause an increase in leakage current. In other words, the insulating film formed of such a high-permittivity material as described above has a considerably poor capability of retaining charges, which reduces the charge retaining capability of capacitors and hence decreases the reliability of DRAMs.

SUMMARY OF THE INVENTION

It is therefore a first object of the present invention to provide a semiconductor integrated-circuit capacitor which uses high-permittivity material as its capacitor insulating film to increase its capacitance and can reduce its leakage current.

It is a second object of the present invention to provide a method of producing a semiconductor integrated-circuit capacitor in which its capacitor insulating film is formed of a high-permittivity material in order to increase its capacitance while its leakage current is low.

The first object of the present invention is attained by a semiconductor integrated-circuit capacitor comprising a lower electrode formed on a semiconductor substrate, a capacitor insulating film formed on said lower electrode, and an upper electrode formed on said insulating film, said capacitor insulating film comprising a high-permittivity material, and at least one of said upper electrode and said lower electrode consisting of a carbon film or a multilayered film composed of a carbon film and a conductor film other than carbon.

The second object of the present invention is attained by a method of manufacturing a semiconductor integrated-circuit capacitor comprising the steps of: forming a capacitor lower electrode on a semiconductor substrate; forming a capacitor insulating film of a high-permittivity material on said capacitor lower electrode; annealing said capacitor insulating film in a gas atmosphere containing excited oxygen; and forming a capacitor upper electrode on said capacitor insulating film that has been annealed.

The second object of the present invention is also attained by a method of manufacturing a semiconductor integrated-circuit capacitor comprising the steps of: forming a capacitor lower electrode on a semiconductor substrate; forming a capacitor insulating film of a high-permittivity material on said capacitor lower electrode; and forming a carbon film as a capacitor upper electrode on said capacitor insulating film at a temperature of 300° C. or more.

The present invention may preferably be adapted for stacked capacitors but can be adapted for different capacitors such as trench capacitors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A to 3D are sectional views which collectively show a process, in the order of steps of the process, of manufacturing an integrated-circuit capacitor in accordance with a first embodiment of the present invention;

FIGS. 4A to 4D are sectional views which collectively show a process, in the order of steps of the process, of manufacturing an integrated-circuit capacitor in accordance with a second embodiment of the present invention;

FIGS. 5A to 5D are sectional views which collectively show a process, in the order of steps of the process, of manufacturing an integrated-circuit capacitor in accordance with a third embodiment of the present invention;

FIGS. 6A to 6C are sectional views which collectively show a process, in the order of steps of the process, of manufacturing an integrated-circuit capacitor in accordance with a fourth embodiment of the present invention;

DETAILED DESCRIPTION OF THE PREFERRED EMBODIMENTS

In the present invention, in order to increase the capacitance of a semiconductor integrated-circuit capacitor, a thin film of high-permittivity material is used as the capacitor insulating film. Examples of such high-permittivity materials include silicon nitride, tantalum pentoxide, zirconium dioxide ($ZrO_2$), hafnium dioxide ($HfO_2$), niobium pentoxide ($Nb_2O_5$), lead titanate ($PbTiO_3$), lead zirconate titanate (PZT), strontium titanate ($SrTiO_3$), barium titanate ($BaTiO_3$), etc. In order to increase the capacitance of the integrated-circuit capacitor, it is particularly preferable that the dielectric film used as a capacitor insulating film have a dielectric constant of 20 or more.

In the integrated capacitor of the present invention, at least one of two capacitor electrodes is formed of a film of carbon. This permits the leakage current to be suppressed even when the capacitor insulating film used is made of one of the above-described high-permittivity materials. Consequently, the capacitor of the present invention is permitted to have very high capacitance due to its excellent ability to retain charges, and reduced leakage current.

Hereinafter, this effect will be described in detail.

A capacitor, which aims to retain charges, is required to have both good insulation between two electrodes thereof and high capacitance. In order to ensure that the capacitor has a high capacitance, it is desired that the capacitor insulating film (dielectric film) be made of a high-permittivity material. However, the use of high-permittivity material for the capacitor insulating film would deteriorate its insulating property.

Figure 1:
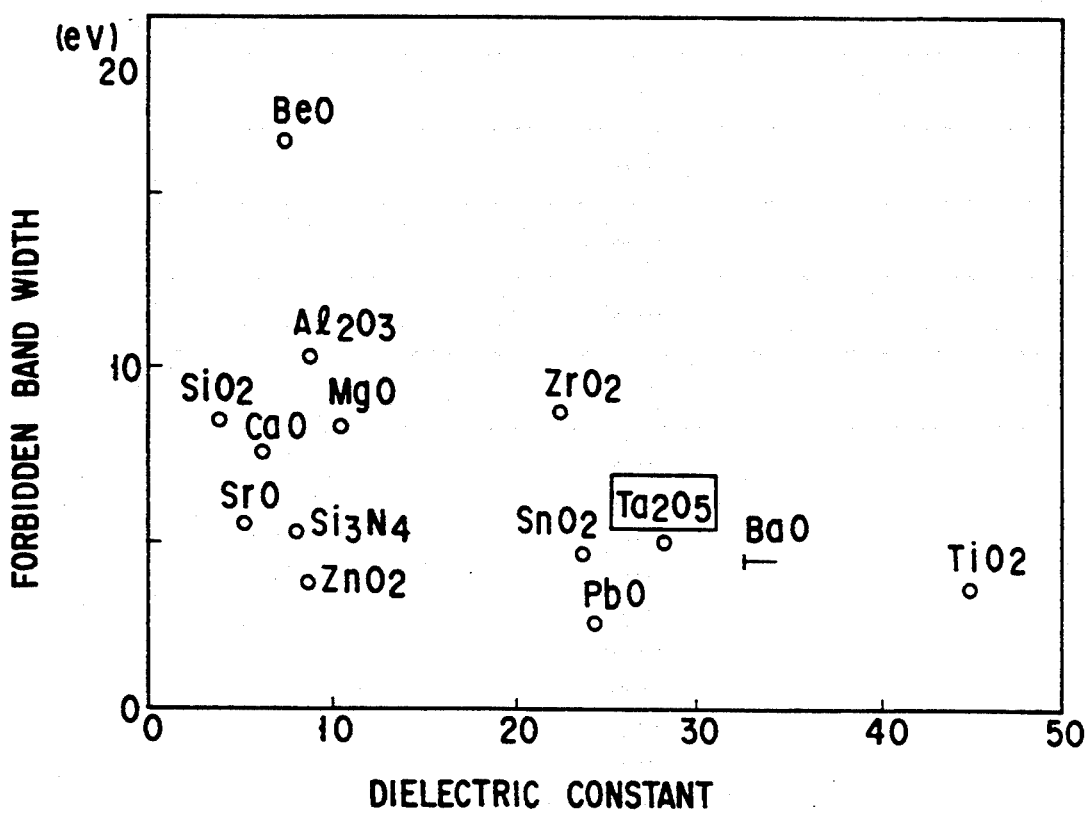
FIG. 1 shows a relationship between the permittivity and forbidden band width of various dielectric materials.

In general, a more dielectric material has a narrower forbidden band. FIG. 1 shows permittivity versus forbidden band width (band gap) for various dielectric materials. This diagram is cited from "Thin Solid Films, 2" by P. J. Harrop and D. S. Campbell, p. 273 (1968). In a capacitor, when the forbidden band of an insulating-film material used is narrow, the energy barrier between the insulating film and the capacitor electrode (i.e., electric conductor) will be low, which produces leakage current at the time of application of a voltage and thus deteriorates insulation characteristic.

In order to obtain a high-performance capacitor conforming to the object of the present invention, therefore, it is required not only to increase its capacitance by the use of a high-permittivity capacitor insulating film but also to reduce leakage current by making high the energy barrier between the insulating film and the capacitor electrode to thereby improve the insulation characteristic.

Those situations for the case where tantalum pentoxide is used for capacitor insulating film will be explained in detail as follows. The dielectric constant (relative permittivity) of tantalum pentoxide is about 28, which is much greater than that of silicon dioxide, i.e., 3.9. However, the forbidden band width of tantalum pentoxide is about 4.5 ev, which is smaller than that of silicon dioxide, i.e., 8 ev. For this reason, the tantalum pentoxide film will produce thermal-excitation-dependent carrier conduction (P-F type conduction) through trap sites in the film and is thus inferior to silicon dioxide film in terms of insulation characteristic. In order to use tantalum pentoxide for the capacitor insulating film, therefore, it is required to use a special means of suppressing leakage current. As a basic means, therefor, the present invention adopts a means of making the energy barrier between the tantalum pentoxide film and the capacitor electrode material higher.

Figure 2:
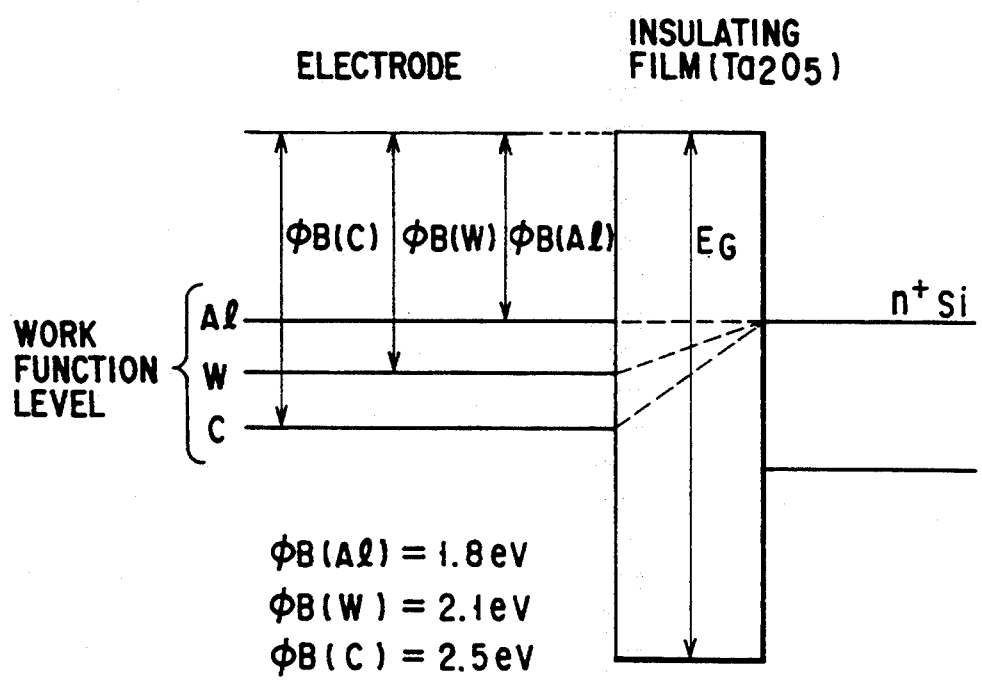
FIG. 2 is an energy-band diagram when tantalum pentoxide film is used as the capacitor insulating film, and one (the lower electrode) of capacitor electrode consists of an n+ silicon film and the other (the upper electrode) consists of one of various conductor films.

FIG. 2 is an energy band diagram when tantalum pentoxide is used for the capacitor insulating film, and an n+ silicon film is used as one (lower electrode) of two capacitor electrodes which are insulated from each other by the insulating film and an aluminum (Al) film, tungsten (W) film or carbon film is used as the other (upper electrode) of the capacitor electrodes. As can be seen from FIG. 2, a conductor electrode with a deeper Fermi level or a greater work function will have a higher energy barrier $\phi_B$ between the capacitor insulating film and the upper electrode. The height of the energy barrier is equal to the depth of the Fermi level of the conductor plate (upper electrode) when the uppermost energy level of the forbidden band width Eg of the capacitor insulating film (tantalum oxide) is referred to. The higher the barrier $\phi_B$ is, the lower the current leakage is. The leakage current suppressing effect due to the energy barrier $\phi_B$ is significantly more when the forbidden band of the insulating-film forming material is narrower, in other words, when the permittivity of the capacitor insulating film is higher. When use is made of a capacitor insulating film which, like tantalum pentoxide film, is higher in permittivity and narrower in forbidden band than silicon dioxide film, therefore, it is remarkably effective to use an electrode material having a greater work function in order to maximize the effect of suppressing the leakage current.

As examples of such materials having great work functions, there are noble metals such as platinum (Pt), etc. The platinum has a work function of 5.4 eV. However, problems with these noble metals are that they are difficult to be formed into a film and to be processed into an electrode pattern. In contrast, the carbon film used in the present invention as the capacitor electrode is excellent in these respects. As shown in FIG. 2, the work function of the carbon film is about 5 ev, which is greater than that of aluminum film (4.3 ev) and that of tungsten film (4.5 ev). As a result, the energy barrier height $\phi_B$ in case of the carbon film being used as the capacitor electrode is 2.5 eV, which is greater than that (1.8 eV) wherein the aluminum film is used and that (2.1 ev) wherein the tungsten film is used. Consequently, the use of a carbon film as the capacitor electrode permits the leakage current to be suppressed. The situation mentioned above is also applied to a case wherein a high-permittivity material other than tantalum pentoxide is used for the capacitor insulating film.

As described above, the capacitor of the present invention is permitted to have a high capacitance by the use of a high-permittivity material for the capacitor insulating film and to reduce leakage current by the use of a carbon film as a capacitor electrode.

Carbon is not much larger in specific resistance in comparison with other metals conventionally used as electrode materials. However, if necessary, use may be made of a multilayer film structure in which a film or films of metals other than carbon are laminated on the carbon film, thereby adjusting the performance of the capacitor electrode.

In addition, the carbon film, serving as a capacitor electrode according to the present invention, can be formed by sputtering technique or a chemical vapor deposition (CVD) that is excellent in step coverage for the three-dimensional structure of a capacitor, and moreover, can be processed into a fine pattern by a reactive ion etching technique using oxygen and the like as a reactive gas. Thus, the conventional LSI manufacturing processes can easily be applied to the manufacture of the capacitors of the present invention.

Next, a manufacturing method of the semiconductor integrated-circuit capacitor of the present invention will be described.

If the conventional LSI manufacturing process were applied unchanged to the manufacture of a capacitor structured as described above, a capacitor insulating film of high-permittivity material would first be formed by sputtering or CVD, and a carbon film would then be formed on the insulating film. In this case, a trace amount of hydrogen would inevitably be entrapped in the capacitor insulating film formed by sputtering or CVD. That is, in the case of sputtering, residual moisture and hydrogen left without being exhausted in the film forming chamber would cause hydrogen to be entrapped in the capacitor insulating film. In the case of CVD, besides the residual moisture and hydrogen, the use of an organometal source in particular would cause more hydrogen to be entrapped in the insulating film.

When a carbon film is formed on the capacitor insulating film in which hydrogen has been entrapped, a reaction will occur between hydrogen in the insulating layer and carbon, thereby forming a hydrocarbon-containing layer at the interface. The layer of hydrocarbon thus formed reduces adhesion between the carbon 10 film and the capacitor insulating film, making the carbon film easy to peel off.

Furthermore, the formation of a hydrocarbon-rich layer at the interface between the capacitor insulating film and the capacitor electrode will degrade the electrical property of the capacitor. That is, the hydrocarbon layer formed at the interface is electrically unstable and thus acts as a high-resistance conductor at low frequencies or DC but cannot pursue high frequencies. As a result, the hydrocarbon layer at the interface will form series capacitance, thus decreasing the apparent capacitance of the capacitor.

As can be seen in the description mentioned above, hydrogen entrapped in the capacitor insulating film remarkably reduces the yield of integrated circuits and degrades the device performance. In order to solve such problems, the manufacturing method of the present invention employs annealing, in a gas atmosphere containing excited oxygen, of a capacitor insulating film of a high-permittivity material before a carbon film is formed on it.

Here, the excited oxygen refers to oxygen in a higher energy state than oxygen molecules in the ground state. Examples of the excited oxygen include oxygen ions (including molecular ions and atomic ions) and oxygen free-radicals (including molecular radicals and atomic oxygen). The atmosphere containing such excited oxygen can be obtained by oxygen plasma, discharge in oxygen gas, or irradiation of an ozone gas with ultraviolet rays.

It is difficult to remove the hydrogen entrapped in the capacitor insulating film by means of simple annealing because it combines with constituent elements of the film. However, the use of an annealing method adopted by the present invention permits the hydrogen in question to be extracted from the film forming elements and to be removed from the film by the action of the excited oxygen. More specifically, such excited oxygen is very active and will permeate the capacitor insulating film at high temperatures. Consequently, when the annealing is carried out at a sufficiently high temperature, the excited oxygen permeates the capacitor insulating film and reacts with hydrogen contained in the insulating film to form water molecules. The resultant water molecules diffuse to the outside and are thus removed. As a result, the formation of a carbon film after the annealing will avoid the peeling of the carbon film and the degradation of the capacitor performance.

It has been revealed that the annealing is similarly effective for the use of a metal other than carbon for the capacitor electrode, such as tungsten, which has been used conventionally. Therefore, the present invention will also cover such embodiments.

The present invention includes a method of further suppressing the leakage current by improving the quality of the carbon film used as the capacitor electrode in manufacturing the semiconductor integrated-circuit capacitor. According to this method, the carbon film is formed at a temperature of 300° C. or more. As will be described later, the inventors of the present invention have confirmed that the formation of the carbon film at such a high temperature makes its work function value greater. As a result, the energy barrier $\phi_B$ between the capacitor electrode and the capacitor insulating film is made higher, permitting the capacitor leakage current to be suppressed more effectively.

As described above, the present invention is intended to achieve increasing the capacitance of a semiconductor integrated-circuit capacitor by using a high-permittivity film as the capacitor insulating film and, at the same time, suppressing the leakage current of the capacitor. To carry out the intention, the present invention discloses three means: (a) using a carbon film as a capacitor electrode, (b) annealing the high-permittivity film in an atmosphere of excited oxygen, and (c) forming the carbon film at a high temperature of 300° C. or more. These means may be used individually or in combination. For evaluating the effect of these means in comparison with the conventional art, the following six types of capacitors were manufactured.

(1) Without annealing, tungsten electrode (conventional)
(2) without annealing, carbon electrode (film forming temperature: ordinary temperature)
(3) without annealing, carbon electrode (film forming temperature: high temperature)
(4) With annealing, tungsten electrode
(5) With annealing, carbon electrode (film forming temperature: ordinary temperature)
(6) with annealing, carbon electrode (film forming temperature: high temperature)

Figure 15:
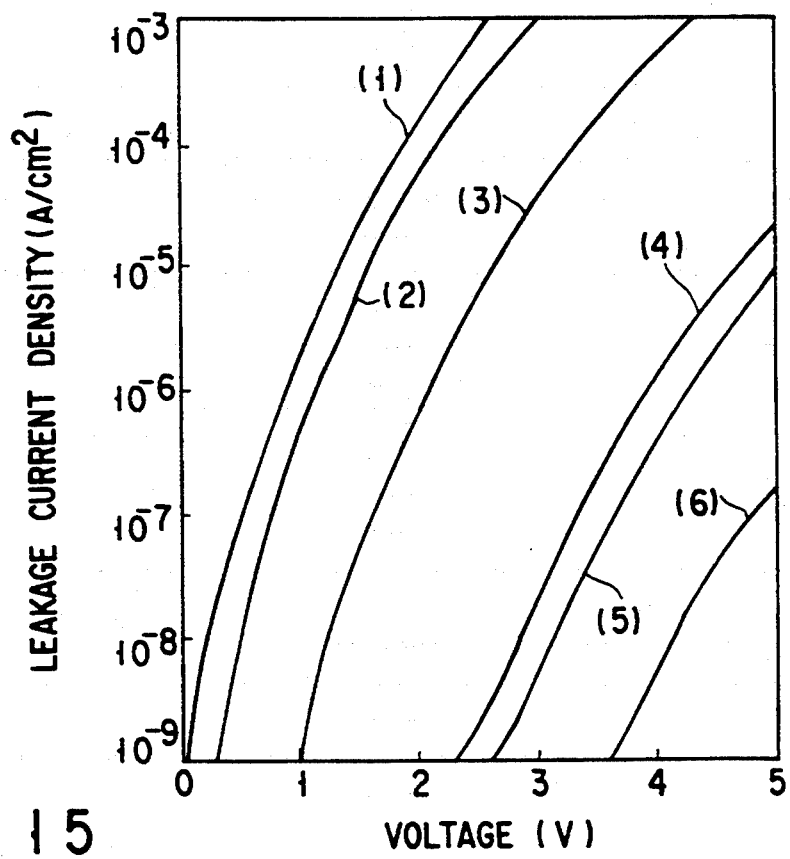
FIG. 15 shows the leakage current suppressing effect for six types of capacitors manufactured under different conditions for comparison.

The leakage current characteristics of the six types of capacitors were measured and the results shown in FIG. 15 were obtained. As can be seen from FIG. 15, although a certain effect over the conventional art can be obtained even when each of the three means is used alone, the combined use of these three means produces a much greater effect.

Hereinafter, reference will be made to the drawings to describe the preferred embodiments of the present invention, which are intended to facilitate the understanding of the present invention and are therefore illustrative only and not restrictive.

In the following description, semiconductor integrated-circuit capacitors according to the embodiments of the present invention and the manufacturing processes therefor will be described together.

Example 1

FIGS. 3A to 3D illustrate manufacturing steps for a capacitor according to a first embodiment of the present invention. The first embodiment is directed to a DRAM having stacked capacitor cells each using an n+ polysilicon film as the capacitor lower electrode (storage node), a tantalum pentoxide film as the capacitor insulating film, and a carbon film as the capacitor upper electrode (plate electrode).

First, the major surface of a p-type silicon substrate having the (100) plane and a resistivity of 10 Ω.cm is selectively oxidized by means of LOCOS (localized oxidation of silicon) to form a device isolation film 102 consisting of a thermally grown thick oxide film. Next, a thin oxide film is thermally grown on the surface area surrounded by the film 102, and an n+ type polysilicon film is then deposited on the thin oxide film by means of CVD. The two superposed films are patterned using conventional photoresist masking and etching to form a gate oxide film 103 and a gate electrode 104. Subsequently, the substrate 101 is subjected to ion implantation using the gate electrode 104 as a blocking mask, whereby n− type regions $105_1$ and $105_2$, separated by a channel region, are formed on a self-alignment basis (FIG. 3A). The n− type regions $105_1$ and $105_2$ serve as drain and source regions, respectively, of a MOS transistor.

Next, a thick CVD oxide film 106 serving as an interlayer insulating film is formed over the entire surface of the substrate and then patterned by conventional photoresist masking and etching to form an opening 107 communicating with the n− type region $105_1$ (FIG. 3B).

Next, a second n+ type polysilicon film is deposited and then patterned by conventional photoresist masking and etching to form an n+ type polysilicon film pattern 108 which is in contact with the n− type region $105_1$. Subsequently, if necessary, a very thin silicon nitride film 109 may be formed on the polysilicon film pattern 108 by direct nitridation in order to prevent an oxide film from naturally growing on the pattern 108 (FIG. 3C).

Next, a tantalum pentoxide film 110 is deposited by reactive sputtering, CVD, or another suitable film forming technique. Subsequently, a carbon film is formed on the tantalum pentoxide film 110 and then patterned by conventional photoresist masking and etching to form a carbon film pattern 111 (FIG. 3D). Note that a trace amount of impurities of, for example, a group III element such as boron (B), or a V group element such as phosphorus (P) or arsenic (As), may be added to the carbon film pattern 111 for the purpose of reducing its specific resistance.

In this manner a memory cell capacitor composed of the capacitor upper electrode consisting of the polysilicon film pattern 108, the capacitor insulating film consisting of the tantalum pentoxide layer 110 and the SiN layer 109, and the capacitor upper electrode consisting of the carbon film pattern 111 is completed.

As usual, the LSI manufacturing process is followed by subsequent steps including the formation of a passivation film, the formation of interconnection wires, etc.

Example 2

FIGS. 4A to 4D illustrate manufacturing steps of a capacitor according to a second embodiment of the present invention. The second embodiment is directed to a DRAM having stacked capacitor cells each of which uses an n+ type polysilicon film as its lower electrode (storage node), a tantalum pentoxide film as its capacitor insulating film, and a two-layer film of carbon/tungsten as its upper electrode.

First, as in Example 1, a device isolation film 202, a gate oxide film 203, a gate electrode 204, and n− type regions $205_1$ and $205_2$ are formed on a p type silicon substrate 201 having a specific resistance of 10 Ω.cm and the (100) plane (FIG. 4A).

Also, as in Example 1, a thick CVD oxide film 206 and an opening 207 communicating with the n− type region 205 are formed (FIG. 4B).

Moreover, in the same manner as in Example 1, an n+ type polysilicon film pattern 208 is formed to come in contact with the n− type region $205_1$ through the opening 207. If necessary, a very thin silicon nitride film 209 may be formed by direct nitridation on the pattern 208 for the same purpose as in Example 1 (FIG. 4C).

Next, a tantalum pentoxide film 210 serving as the capacitor insulating film is deposited by reactive sputtering, CVD, or another suitable film forming technique. Subsequently, a carbon film and a tungsten film are formed in sequence and then patterned by conventional photoresist masking and etching to form the capacitor upper electrode consisting of layers of a carbon film pattern 211 and a tungsten film pattern 212 (FIG. 4D).

In this manner a memory cell capacitor composed of the capacitor lower electrode consisting of the polysilicon film pattern 208, the capacitor insulating layer consisting of the tantalum pentoxide film 210, and the capacitor upper electrode consisting of two layers of the carbon film pattern 211 and the tungsten film pattern 212 is completed.

As usual, the LSI manufacturing process is followed by subsequent steps including the formation of a passivation film, the formation of connecting wires, etc.

Figure 12:
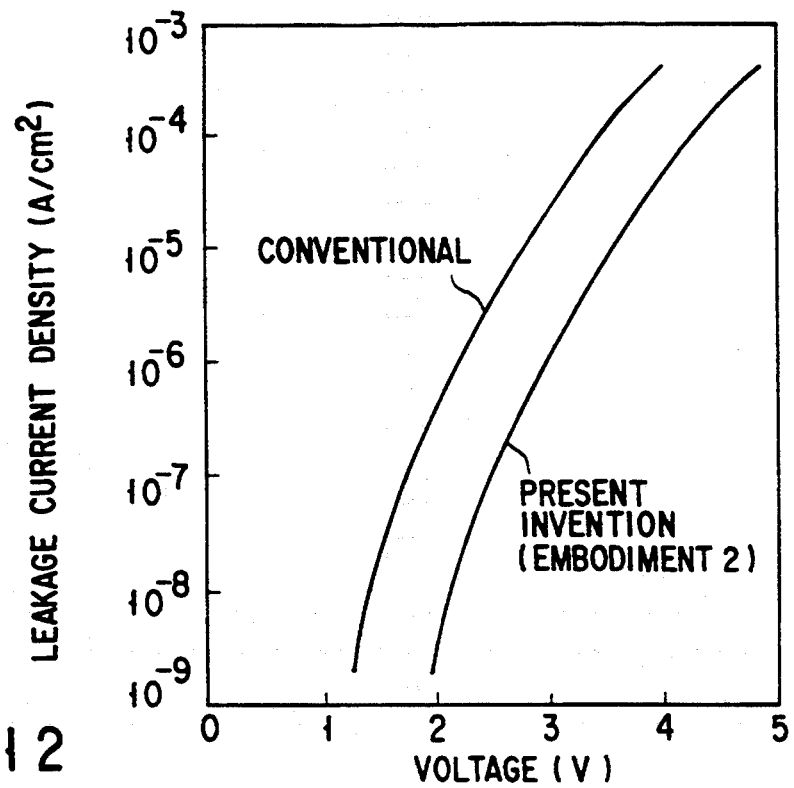
FIG. 12 is a graph illustrating leakage characteristics of the capacitor according to the second embodiment of the present invention in comparison with a conventional capacitor.

Now, the leakage characteristics (I-V characteristics) were evaluated for the capacitor of the second embodiment. For comparison, the leakage characteristics were likewise evaluated for a conventional capacitor having its insulating film made of a tantalum pentoxide film and its upper electrode made of a tungsten film only. The results are shown in FIG. 12. As can be seen from the graph, with the same voltage applied, the capacitor of the present embodiment bring a substantial reduction in leakage current as compared with the conventional capacitor. It will be understood from the results that the use of a carbon film as a capacitor electrode permits leakage current to be suppressed even when a high-permittivity material is used for the capacitor insulating film to increase capacitance.

Example 3

FIGS. 5A to 5D illustrate manufacturing steps of a capacitor according to a third embodiment of the present invention. The third embodiment is directed to a DRAM having stacked capacitor cells each of which uses a carbon film as its lower electrode (storage node), a strontium titanate ($SrTiO_3$) film as its capacitor insulating film, and a carbon film as its upper electrode (plate electrode).

First, as in Example 1, a device isolation film 302, an oxide film 303, a gate electrode 304, and $n^-$ type regions $305_1$ and $305_2$ are formed on a p type silicon substrate 301 having a specific resistance of 10 $\Omega$.cm and the (100) plane (FIG. 5A).

Also, as in Example 1, a thick CVD oxide film 306 and an opening 307 communicating with the $n^-$ type region 305 are formed (FIG. 5B).

Next, a carbon film is deposited and then patterned by conventional photoresist masking and etching to form a carbon film pattern 308 which is in contact with the $n^-$ type region $305_1$ through the opening 307 (FIG. 5C).

Next, a strontium titanate film 309 serving as the capacitor insulating film is deposited by reactive sputtering, CVD, or another suitable film forming technique. Subsequently, a carbon film is deposited on the strontium titanate film 309, and it is then patterned by conventional photoresist masking and etching to form a carbon film pattern 310 (FIG. 5D).

In this manner a memory cell capacitor composed of the capacitor lower electrode consisting of the carbon film pattern 308, the capacitor insulating layer consisting of the strontium titanate film 309, and the capacitor upper electrode consisting of the carbon film pattern 310 is completed.

As usual, the LSI manufacturing process includes subsequent steps of formation of a passivation film, formation of connecting wires, etc.

Example 4

FIGS. 6A to 6C illustrate the manufacturing steps of a capacitor according to a fourth embodiment of the present invention. This fourth embodiment is directed to a DRAM having stacked capacitor cells each of which uses an $n^+$ type polysilicon film as its lower electrode (storage node), a tantalum pentoxide film as its capacitor insulating film, and a carbon film formed by sputtering as its upper electrode (plate electrode). This Example involves a capacitor manufacturing method including a step of annealing the tantalum pentoxide film at high temperature in an atmosphere of active or excited oxygen.

First, the major surface of a (100) p-type silicon substrate 401 having a specific resistance of 10 $\Omega$.cm is selectively oxidized by LOCOS to form a thick device isolation oxide film 402. Next, a thin oxide film is formed on the surface of a device region surrounded by the device isolation film 402, and an $n^+$ type polysilicon film is then deposited by CVD on the oxide film. Subsequently, the oxide film and the polysilicon film are patterned by conventional photoresist masking and etching to form a gate oxide film 403 and a gate electrode 404. The substrate 101 is subsequently subjected to ion implantation using the gate electrode 404 as a blocking mask, whereby $n^-$ type regions $405_1$ and $405_2$ separated by a channel region are formed on a self-alignment basis. The $n^-$ type regions $405_1$ and $405_2$ serve as the source and drain regions, respectively, of a MOS transistor. Next, a thick CVD oxide film 406 serving as an interlayer insulating film is formed on the entire surface of the substrate and then patterned by conventional photoresist masking and etching to form an opening communicating with the $n^-$ type region $405_1$. Subsequently, tungsten silicide is deposited and patterned by conventional photoresist masking and etching to form a bit line 407 which contacts the $n^-$ type region $405_1$ at the opening. Subsequently, a second CVD oxide film 408 is deposited (FIG. 6A).

Next, subsequent to the formation of an opening communicating with the $n^-$ type region $405_2$, a second $n^+$ type polysilicon film is deposited and then patterned by conventional photoresist masking and etching. Thereby, an $n^+$ type polysilicon film 409 is formed which is in contact with the $n^-$ type region $405_2$ at the opening. Subsequently, if necessary, a very thin silicon nitride film 410 may be formed on the polysilicon film pattern 409 by direct nitridation in order to prevent oxide from growing naturally on the pattern 409. Next, a CVD process using a source of, for example, Ta-$(OC_2H_5)_5$, is performed to deposit a tantalum pentoxide film 411 to a thickness of about 200 Å (FIG. 6B).

Figure 9:
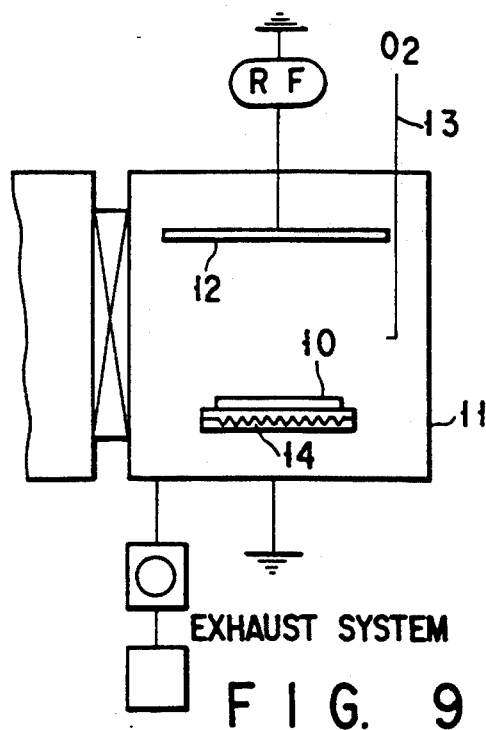
FIG. 9 illustrates an annealing device used in Example 4.

Next, in such an annealing chamber 11 equipped with an RF electrode 12 as shown in FIG. 9, a wafer 10 in the state of FIG. 6B is annealed. In this case, an oxygen gas is supplied by an oxygen line 13 and an RF discharge at 50 to 300W is performed, so that annealing is carried out in a low-pressure oxygen plasma atmosphere. The wafer is placed on a heater 14 so that it is heated to a temperature between 400° and 700° C.

Next, a carbon film is formed on the tantalum pentoxide film 411 by sputtering and then patterned by conventional photolithographic masking and etching to form a carbon film pattern 412 used as the capacitor plate electrode (FIG. 6C). If necessary, a metal film may be formed on the carbon film pattern.

In the manner as described above, a memory cell capacitor is completed which is composed of the lower electrode of the polysilicon film pattern 409, the capacitor insulating film of the tantalum pentoxide film 411, and the upper electrode of the carbon film pattern 412.

The usual LSI manufacturing process will include subsequent steps of forming a passivation film, forming connecting wires, etc.

Example 5

Figure 7A:
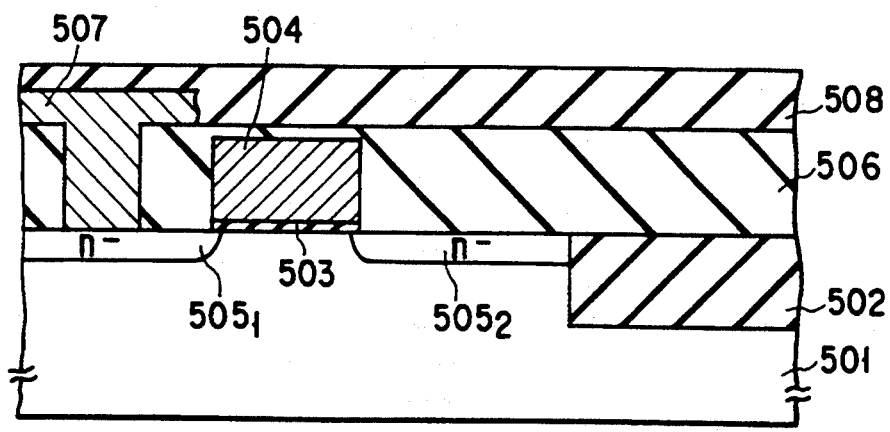
FIGS. 7A to 7C are sectional views which collectively show a process, in the order of steps of the process, of manufacturing an integrated-circuit capacitor in accordance with a fifth embodiment of the present invention.
Figure 7B:
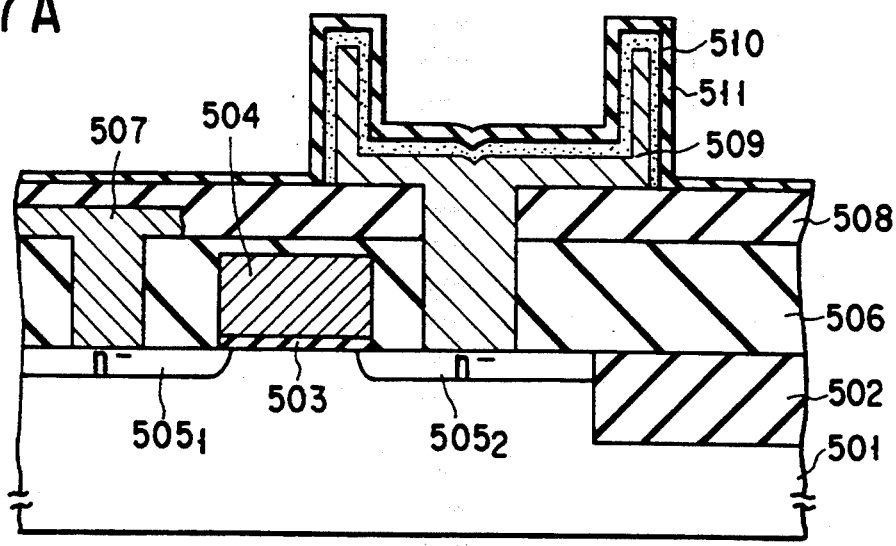
Figure 7C:
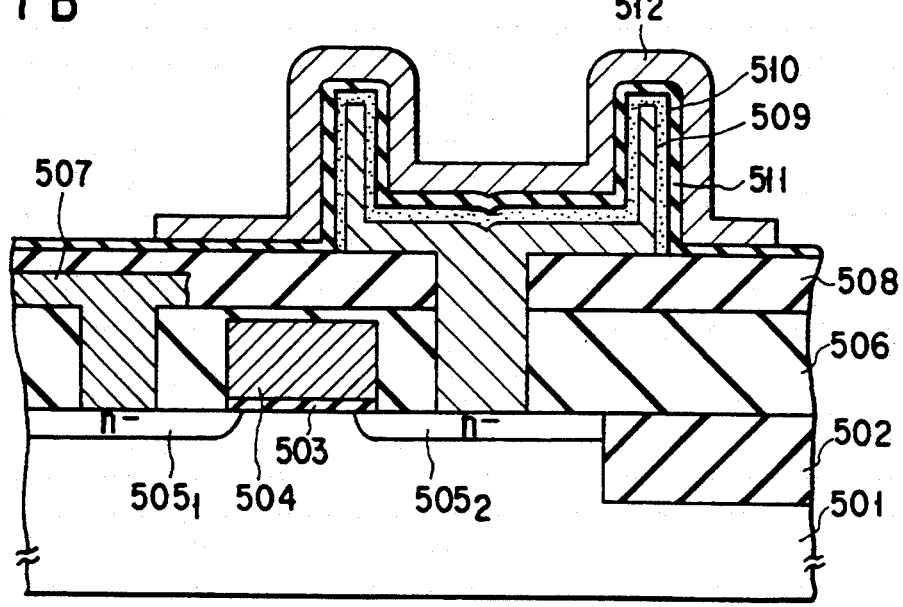

FIGS. 7A to 7C illustrate manufacturing steps of a capacitor according to a fifth embodiment of the present invention. In the fifth embodiment, which is a modification of the fourth embodiment, the capacitor electrodes are formed in the shape of a cylinder to increase the capacitance. This Example also includes a step of annealing the tantalum pentoxide film at high temperature in an active or excited oxygen atmosphere.

First, a (100) p type silicon substrate 501 having a specific resistance of 10 Ω.cm is used in forming a device isolation film 502, a gate oxide film 503, a gate electrode 504, n− type regions $505_1$ and $505_2$, a thick CVD oxide film 506, a bit line 507, and a second CVD oxide film 508 (FIG. 7A) in the same manner as in Example 4.

Next, as in Example 4, subsequent to the formation of an opening communicating with the n− type region $505_2$, an n+ type polysilicon film pattern 509 is formed which is in contact with the region $505_2$ at the opening. In this Example, however, the n+ type polysilicon film pattern 509 is formed in the shape of a cylinder as shown for the purpose of increasing the capacitor area. Subsequently, as in Example 4, a very thin silicon nitride film 510 is, if necessary, formed by direct nitridation on the polysilicon film pattern 509, and a tantalum pentoxide film 511 is deposited to a thickness of about 200 A (FIG. 7B).

Figure 10:
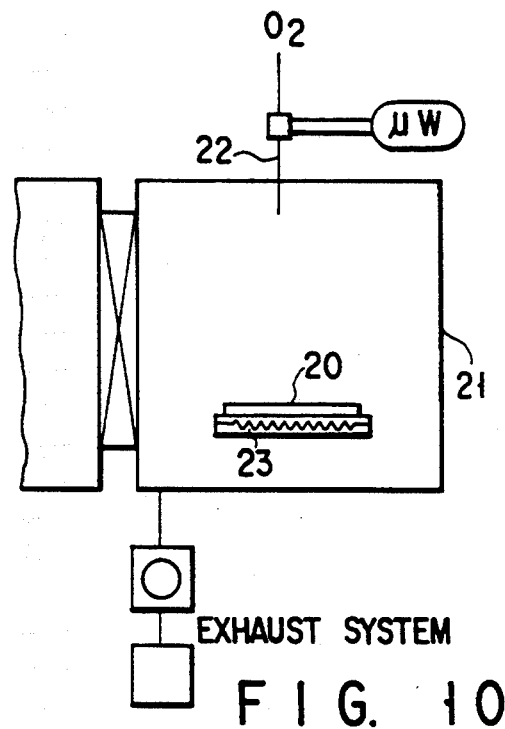
FIG. 10 illustrates an annealing device used in Example 5.

Next, in such an annealing chamber 21 as shown in FIG. 10, a wafer 20 in the state of FIG. 7B is annealed. In this case, an anneal is performed in an atmosphere of oxygen radicals which are produced by microwave discharge at 100 to 700W in an microwave discharge device 21 supplied with oxygen and then supplied to the annealing chamber through a line 22. The wafer 20 is placed on a heater 23 so that it is heated to a temperature between 400° and 700° C.

Next, a carbon film 512 is formed on the tantalum pentoxide film 511 by CVD. The CVD carbon film 512 is deposited at a thickness of about 200 A by introducing methane gas onto the wafer in a temperature between 300 and 400K and causing a chemical reaction by radio frequency (RF) discharge. Besides methane gas, ethylene, styrene, butadiene, benzene, toluene or xylene gas may be used as the CVD source. The carbon film 512 thus formed is patterned by conventional photolithographic masking and etching to form the carbon film pattern 512 which is used as a plate electrode (FIG. 7C).

In the manner described above a memory cell capacitor is completed which is composed of the lower electrode consisting of the polysilicon film pattern 509, the capacitor insulating film consisting of the tantalum pentoxide film 511, and the upper electrode consisting of the carbon film pattern 512.

The usual LSI manufacturing process includes subsequent steps of forming a passivation film, forming connecting wires, etc.

Example 6

Figure 8A:
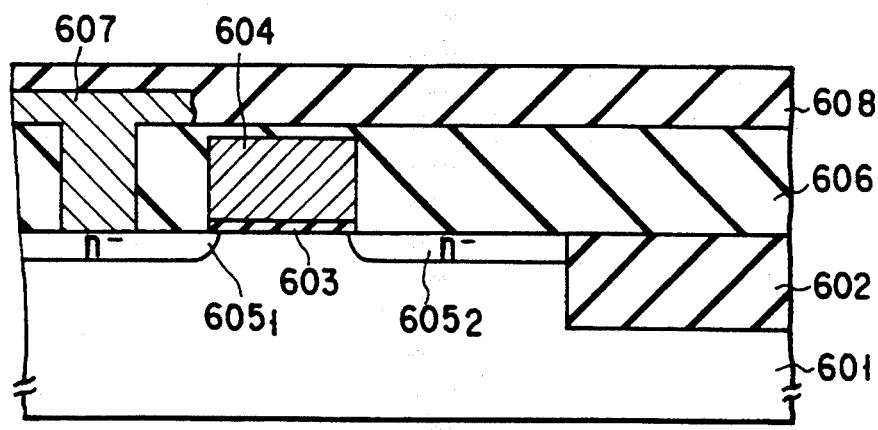
FIGS. 8A to 8C are sectional views which collectively show a process, in the order of steps of the process, of manufacturing an integrated-circuit capacitor in accordance with a sixth embodiment of the present invention.
Figure 8B:
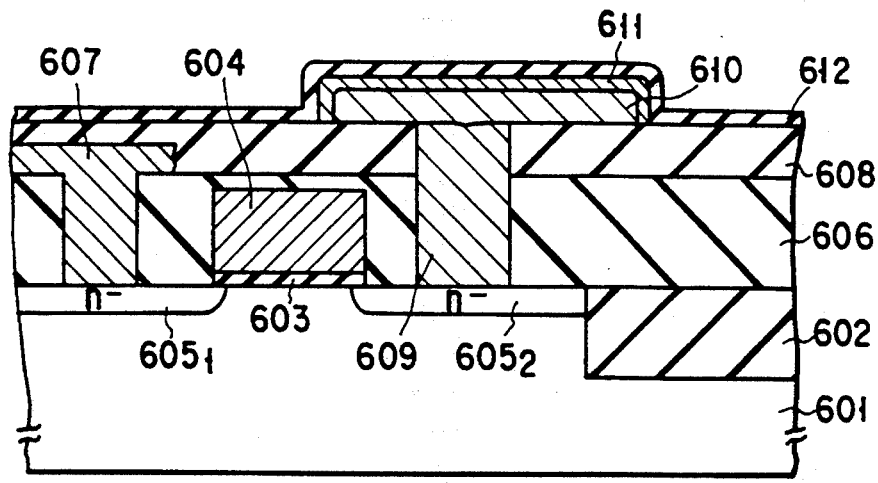
Figure 8C:
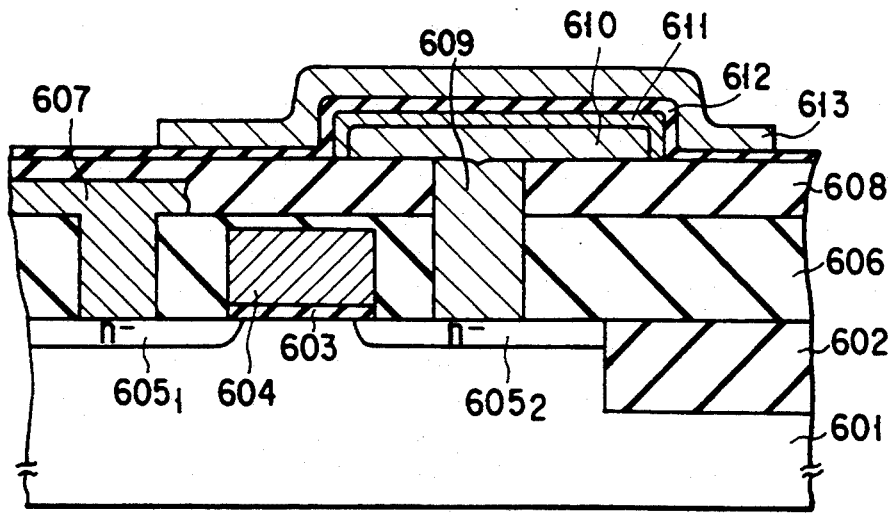

FIGS. 8A to 8C illustrate manufacturing steps of a capacitor according to a sixth embodiment of the present invention. This embodiment is directed to a DRAM having stacked capacitor cells each of which uses a film of platinum as its lower electrode (storage node), a film of strontium titanate as its capacitor insulating film, and a film of carbon as its upper electrode (plate electrode). This Example also includes a step of annealing the strontium titanate film at high temperature in an active or excited oxygen atmosphere.

First, a (100) p type silicon substrate 601 having a specific resistance of 10 Ω.cm is used in forming a device isolation film 602, a gate oxide film 603, a gate electrode 604, n− type regions $605_1$ and $605_2$, a thick CVD oxide film 606, a bit line 607, and a second CVD oxide film 608 in the same manner as in Example 4 (FIG. 8A).

Next, after the formation of an opening communicating with the n− type region $605_2$, a second n+ polysilicon film 609 is deposited and then etched back. Thereby, the second n+ type polysilicon film 609 is left buried in the opening and contacts to the n+ type region $605_2$. Subsequently, a film of titanium nitride (TiN) is deposited over the entire surface of the wafer and then patterned by conventional photolithographic masking and etching to form a titanium nitride film pattern 610 which is in contact with the second n+ type polysilicon film 609. Further, a platinum film 611 is selectively formed only on the titanium nitride film pattern 610 by plating, for example. Next, a strontium titanate ($SrTiO_3$) film 612 is formed over the entire surface by CVD, sputtering, or another suitable film forming technique (FIG. 8B).

Figure 11:
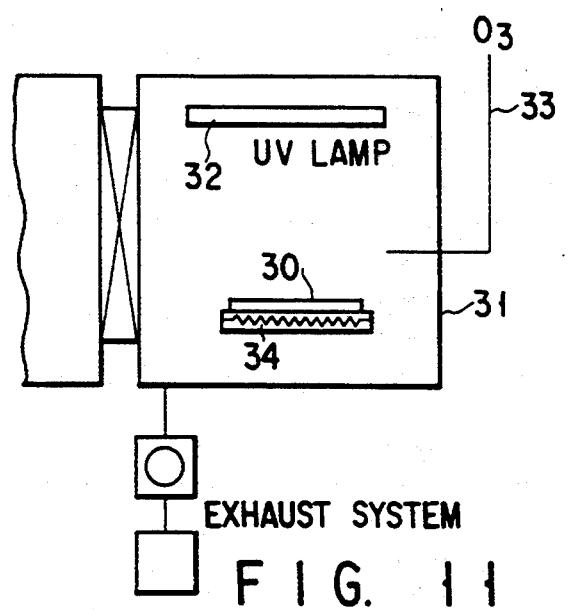
FIG. 11 illustrates an annealing device used in Example 6.

Next, the wafer in the state of FIG. 8B is subjected to annealing in such an annealing chamber 31 equipped with a UV (ultraviolet) lamp 32 as shown in FIG. 11. In this case, the annealing is performed in the ozone gas supplied from a line 33 while the wafer is irradiated with ultraviolet rays from the UV lamp 32. The wafer is placed on a heater 14 and heated to a given temperature.

Next, as in Example 5, a carbon film is formed by CVD and patterned by conventional photolithographic masking and etching to form a carbon film pattern 613 serving as the capacitor plate electrode (FIG. 8C).

In the manner described above a memory cell capacitor is completed which is composed of the lower electrode consisting of the platinum film 611, the capacitor insulating film consisting of the strontium titanate film 612, and the upper electrode consisting of the carbon film pattern 613.

The usual LSI manufacturing process includes subsequent steps of the formation of a passivation film, the formation of connecting wires, etc.

Example 7

This Example relates to forming a carbon film used as a capacitor electrode at a temperature of 300° C. or more, thereby increasing the work function of the carbon film and further decreasing the capacitor leakage current.

In this Example, the capacitor shown in FIG. 6C was fabricated in exactly the same manner as in Example 4 except that the upper electrode 412 was formed in the following manner.

That is, in this Example, the carbon film 412 was formed by sputtering with the wafer maintained at different temperatures of room temperature, 150° C., 300° C. and 450° C. and then patterned into the upper electrode 412.

Figure 13:
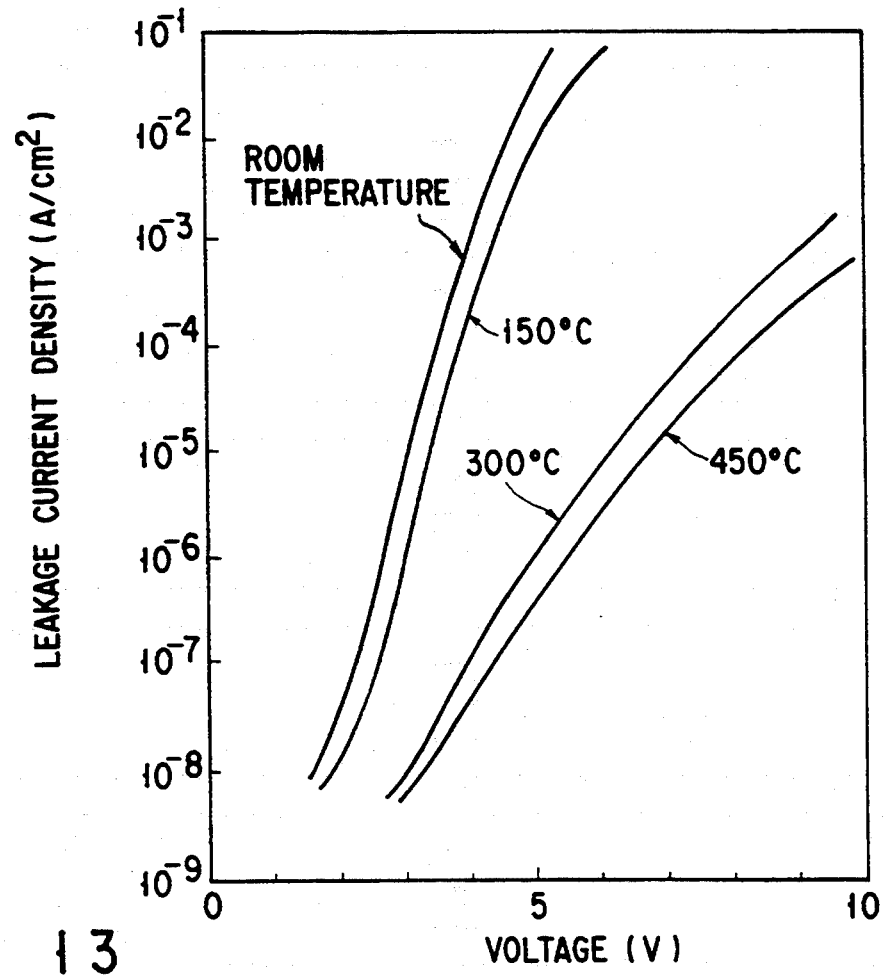
FIG. 13 is a graph illustrating current leakage characteristics of the capacitor according to the fourth embodiment of the present invention in relation to several given temperatures at which the capacitor upper electrode (carbon film) is formed.

The four types of capacitors thus obtained under the different conditions were examined for I-V characteristics and the results shown in FIG. 13 were obtained. It will be seen from FIG. 13 that a substantial reduction in leakage current is attained when the carbon film 412 is formed at a temperature of 300° C. or more.

Figure 14:
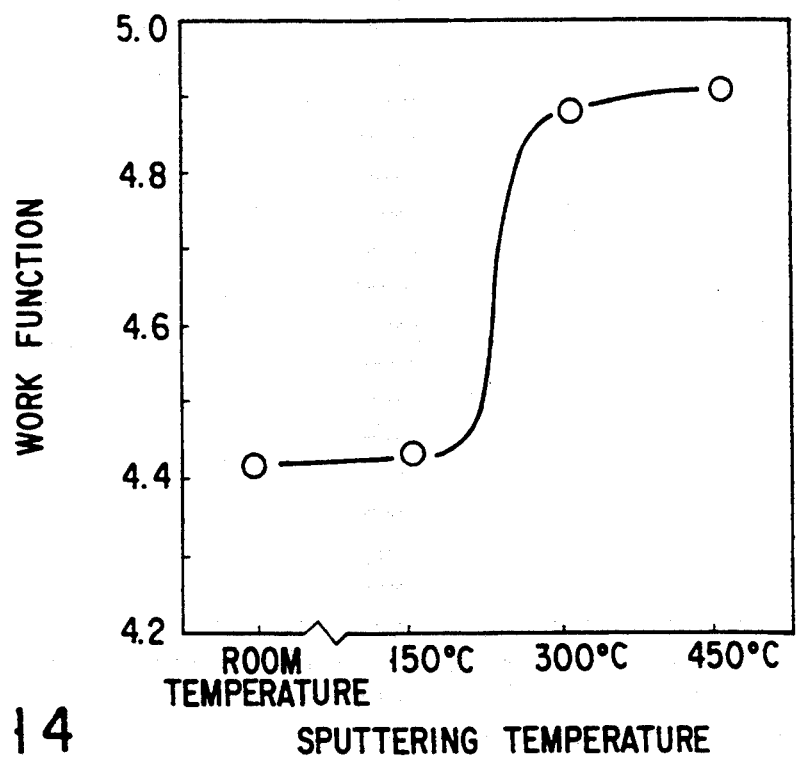
FIG. 14 shows carbon-film work function versus carbon-film forming temperature.

In order to search for the cause of the results in FIG. 13, the upper electrode of silicon oxide capacitor (MOS capacitor) was formed of a carbon film under the same conditions as described above, and the C-V characteristics of the resulting MOS capacitor was measured. The work function of the carbon film formed at each of the above temperatures was then obtained from a shift in the C-V curve (a shift in a flatband voltage). The results are shown in FIG. 14. It will be understood from the figure that the work function of the carbon film increases sharply at temperatures of 300° C. or more. Therefore, a substantial reduction in leakage current seems to be caused by a remarkable increase in the work function value of the carbon film when formed at a temperature of 300° C. or more and the resulting high energy barrier between the capacitor insulating film and the carbon film.

As described above in detail, the present invention can provide a semiconductor integrated-circuit capacitor having reduced leakage current and high storage capacitance because of the use of a carbon film as a capacitor electrode. This will increase the reliability and performance of DRAMs.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated-circuit capacitor comprising a lower electrode formed on a semiconductor substrate, a capacitor insulating film formed on said lower electrode, and an upper electrode formed on said insulating film, wherein said capacitor insulating film comprises a high-permittivity material, and only one of said upper electrode and said lower electrode comprises a carbon film.

2. A semiconductor integrated-circuit capacitor according to claim 1, wherein said high-permittivity material is selected form the group consisting of tantalum pentoxide, zirconium dioxide ($ZrO_2$), hafnium dioxide ($HfO_2$), niobium pentoxide ($Nb_2O_5$), lead titanate ($PbTiO_3$), lead zirconate titanate (PZT), strontium titanate ($SrTiO_3$), and barium titanate ($BaTiO_3$).

3. A semiconductor integrated-circuit capacitor according to claim 1, wherein said high-permittivity material has a relative permittivity of 20 or more.

4. A semiconductor integrated-circuit capacitor according to claim 1, wherein said lower electrode consists essentially of a layer of impurity-doped silicon, and said upper electrode consists essentially of said carbon film.

5. A semiconductor integrated-circuit capacitor according to claim 1, wherein said lower electrode consists essentially of a layer of impurity-doped silicon, and said upper electrode consists essentially of a multilayered film composed of said carbon film and a conductor film other than carbon.

6. A semiconductor integrated-circuit capacitor according to claim 1, wherein said lower electrode consists essentially of a film of metal, and said upper electrode consists essentially of said carbon film.

7. A semiconductor integrated-circuit capacitor according to claim 1, wherein said lower electrode consists essentially of a film of metal, and said upper electrode consists essentially of a multilayered film composed of said carbon film and a conductor film other than carbon.

8. A semiconductor integrated-circuit capacitor comprising a lower electrode formed on a semiconductor substrate, a capacitor insulating film formed on said lower electrode, and an upper electrode formed on said insulating film, wherein said capacitor insulating film comprises a high-permittivity material, and only one of said upper electrode and said lower electrode comprises a multilayered film composed of a carbon film and a conductor film other than carbon.

9. A semiconductor integrated-circuit capacitor according to claim 8, wherein said high-permittivity material is selected from the group consisting of tantalum pentoxide, zirconium dioxide ($ZrO_2$), hafnium dioxide ($HfO_2$), niobium pentoxide ($Nb_2O_5$), lead titanate ($PbTiO_3$), lead zirconate titanate (PZT), strontium titanate ($SrTiO_3$), and barium titanate ($BaTiO_3$).

10. A semiconductor integrated-circuit capacitor according to claim 8, wherein said high-permittivity material has a relative permittivity of 20 or more.

11. A semiconductor integrated-circuit capacitor according to claim 8, wherein said lower electrode consists essentially of a layer of impurity-doped silicon, and said upper electrode consists essentially of a multilayered film composed of said carbon film and said conductor film other than carbon.

12. A semiconductor integrated-circuit capacitor according to claim 8, wherein said lower electrode consists essentially of a film of metal, and said upper electrode consists essentially of a multilayered film composed of said carbon film and said conductor film other than carbon.

13. A semiconductor integrated-circuit capacitor comprising a lower electrode formed on a semiconductor substrate, a capacitor insulating film formed on said lower electrode, and an upper electrode formed on said insulating film, wherein said capacitor insulating film comprises silicon nitride, and only one of said upper electrode and said lower electrode consists essentially of a carbon film.

14. A semiconductor integrated-circuit capacitor comprising a lower electrode formed on a semiconductor substrate, a capacitor insulating film formed on said lower electrode, and an upper electrode formed on said insulating film, wherein said capacitor insulating film comprises silicon nitride, and only one of said upper electrode and said lower electrode comprises a multilayered film composed of a carbon film and a conductor film other than carbon.

* * * * *